(12) United States Patent  (10) Patent No.: US 7,619,900 B2
McClure et al.  (45) Date of Patent: Nov. 17, 2009

(54) DUAL-BOARD CASE FOR MULTI-MAINBOARD SYSTEM

(75) Inventors: John McClure, Taipei (TW); Chun-Hung Lee, Taipei (TW)

(73) Assignee: Mitac International Corp., Taoyuan (TW)

( * ) Notice: Subject to any disclaimer, the term of this patent is extended or adjusted under 35 U.S.C. 154(b) by 281 days.

(21) Appl. No.: 11/627,304

(22) Filed: Jan. 25, 2007

(65) Prior Publication Data

US 2008/0180925 A1 Jul. 31, 2008

(51) Int. Cl.
H05K 5/00 (2006.01)
(52) U.S. Cl. .................. 361/752; 361/790; 361/800
(58) Field of Classification Search ............. 361/752, 361/800, 790, 797, 686, 600
See application file for complete search history.

(56) References Cited

U.S. PATENT DOCUMENTS

| 4,478,331 A | * | 10/1984 | Ruin | 206/707 |
| 5,848,718 A | * | 12/1998 | Colwell | 220/4.02 |
| 6,178,094 B1 | * | 1/2001 | Hakozaki | 361/796 |
| 6,257,776 B1 | * | 7/2001 | Sakimoto | 396/448 |
| 6,278,615 B1 | * | 8/2001 | Brezina et al. | 361/799 |
| 7,002,810 B1 | * | 2/2006 | Becker et al. | 361/796 |

* cited by examiner

Primary Examiner—Hung S Bui
(74) Attorney, Agent, or Firm—Quintero Law Office (57) ABSTRACT

A dual-board case for multi-mainboard system includes a rectangular-sectioned tubular housing, in which two track sets are provided; and two mainboard trays being movably mounted on the two track sets to locate at an interior of two opposite lateral walls of the tubular housing. Each of the two mainboard trays has a loading surface, on which a mainboard is mounted; and the two mainboard trays are mounted on the track sets with their loading surfaces and accordingly, the two mainboards mounted thereon facing toward each other. Therefore, the dual-board case allows a multi-mainboard system to have optimal spatial arrangement to achieve best heat-dissipation efficiency and largely reduce noises.

21 Claims, 8 Drawing Sheets

DUAL-BOARD CASE FOR MULTI-MAINBOARD SYSTEM

BACKGROUND OF THE INVENTION

1. Field of Invention

The present invention relates to a computer case, and more particularly to a dual-board case for a multi-mainboard system.

2. Description of the Related Art

With the highly modularized blade architecture, a blade server has the advantages of high density, convenient management, easy expansion, and suitable for special applications. Generally speaking, the blade architecture is one of the best choices for high performance computing (HPC) systems. However, a HPC system produces more heat than general systems while the high density blade architecture reduces the heat-dissipation efficiency. Currently, some of the HPC systems adopt a liquid cooling system that provides high heat-dissipation efficiency. However, when the liquid cooling system effectively enhances heat-dissipation efficiency, it also increases the complication and cost in manufacturing the HPC system.

Figure 1:
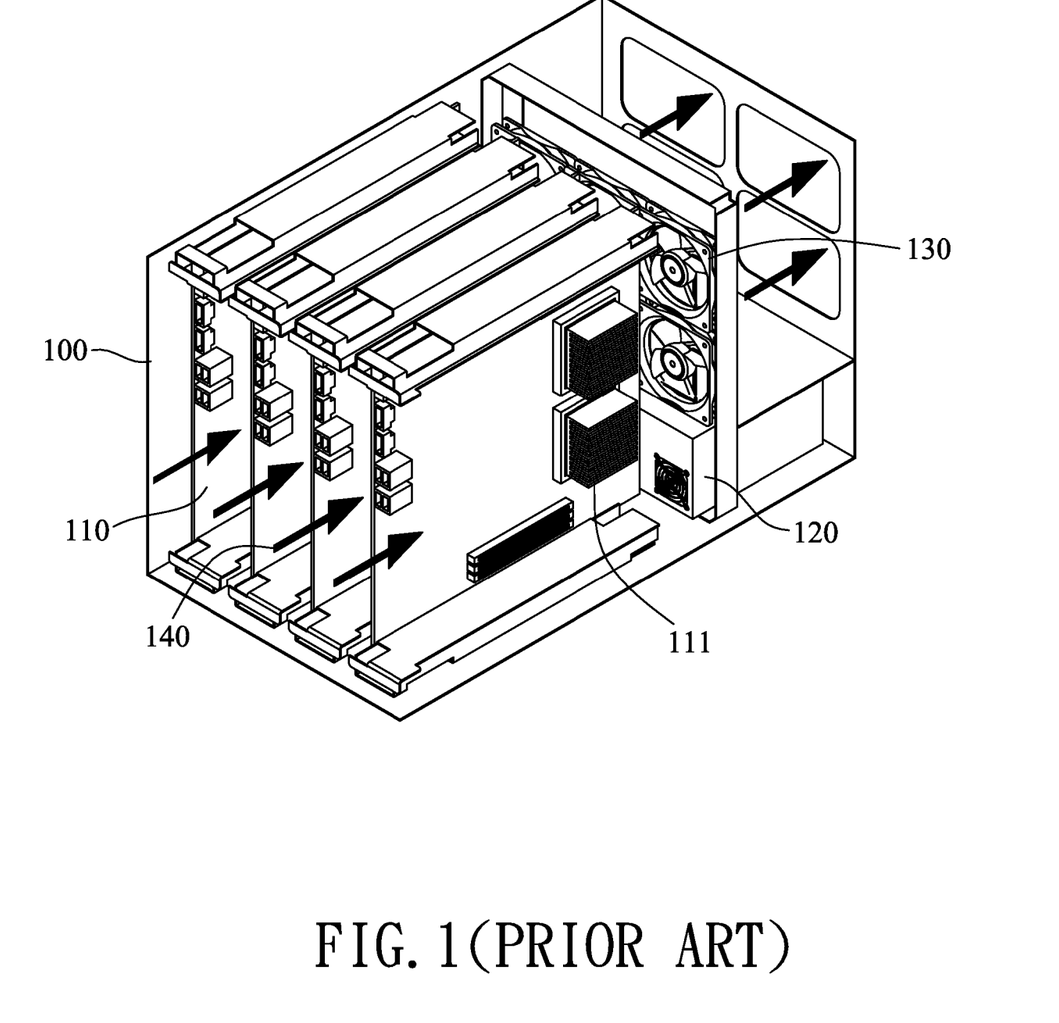

FIG. 1 shows a conventional personal supercomputer adopting the blade architecture. The personal supercomputer with blade architecture is particularly designed for performing small-scaled but highly complicate computing. As shown in FIG. 1, the personal supercomputer with blade architecture has several mainboards 110 parallelly arranged in a front inner space of a computer case 100. The parallelly arranged mainboards 110 divide the front inner space of the computer case 100 into several sub-spaces to serve as airflow passages, just like a common blade architecture. In a rear lower inner space of the computer case 100, a power supply with fan 120 is mounted. And, in a rear upper inner space of the computer case 100, several main fans 130 are mounted to serve as a major cooling airflow source. Airflow 140 sucked into the computer case 100 via a front end thereof passes through each of the sub-spaces and the main fans 130 to finally flow out of the computer case 100 via a rear end thereof.

A big problem with the above-described arrangement is the narrow sub-spaces in the computer case 100 form a big hindrance to good heat dissipation. Meanwhile, noise is produced due to collision of air molecules with different elements mounted in the computer case 100. The spaced narrow airflow passages with uneven surfaces tend to cause more turbulences and louder whooshing sound. For air to smoothly flow in the spaced narrow airflow passages with sufficient air pressure to pass through all small spaces between any two adjacent radiation fins 111 provided on the multiple mainboards 110, small-size fans with high rotary speed must be used. These high-speed small fans also produce high decibel (dB) noise during operation thereof. Moreover, since the multiple mainboards 110 are parallelly spaced in the front inner space of the computer case 100 to face toward the same direction, the radiation fins 111 on each of the mainboards 110 have a length being limited by a distance between two adjacent mainboards 110. In other words, when it is desired to increase the size of fans 130 or the length of radiation fins 111, an overall width of the computer case 100 would inevitably be increased correspondingly. Therefore, it is rather difficult to obtain enhanced heat-dissipation efficiency by increasing the size of the radiation fins 111 in the HPC systems adopting the blade architecture.

SUMMARY OF THE INVENTION

It is therefore a primary object of the present invention to provide a dual-board case for multi-mainboard system, so that the system may have better spatial arrangement to thereby enable optimal heat-dissipation efficiency and largely reduced noise.

To achieve the above objects, the dual-board case for multi-mainboard system according to the present invention includes a substantially rectangular-sectioned tubular housing, two track sets, and two mainboard trays.

In a preferred embodiment of the present invention, the two track sets are spaced from each other by a predetermined distance, and each of the track sets includes one or more tracks. The tracks are located at an interior of top and/or bottom wall of the tubular housing and extended between two open ends of the tubular housing. The mainboard trays are movably mounted on the track sets and have a loading surface each. Two mainboards are independently mounted on the loading surfaces of the two mainboard trays. Wherein, the two mainboard trays are mounted on the track sets with their loading surfaces facing toward each other.

Each of the two mainboards mounted on the mainboard trays in the tubular housing is provided at a position near one open end of the tubular housing with one or more processors.

In a preferred embodiment of the present invention, the processors are staggered on the two facing mainboards, so that a distance between the loading surface and a top of radiation fins attached to any processor on the mainboard mounted on that loading surface may be larger than or equal to one half of a distance between the two track sets.

In a preferred embodiment of the present invention, the dual-board case for multi-mainboard system further includes at least one cover plate. The cover plate is a substantially rectangular plate for mounting to one of the two open ends of the tubular housing. The cover plate is provided with several fan vents. Cooling fans may be mounted on an interior of the cover plate corresponding to the fan vents to assist in good flowing of cooling airflow.

In a preferred embodiment of the present invention, the tubular housing is provided on an exterior of the top and/or the bottom wall with locating tracks, which are extended between the two open ends of the tubular housing for the dual-board case to movably mount to other external mechanisms.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1 schematically shows a conventional personal supercomputer with blade architecture.

DETAILED DESCRIPTION OF THE INVENTION

The present invention is now described with reference to the accompanying drawing, wherein all the reference numerals shown in the specification correspond to those shown in the accompanying drawings.

Figure 2:
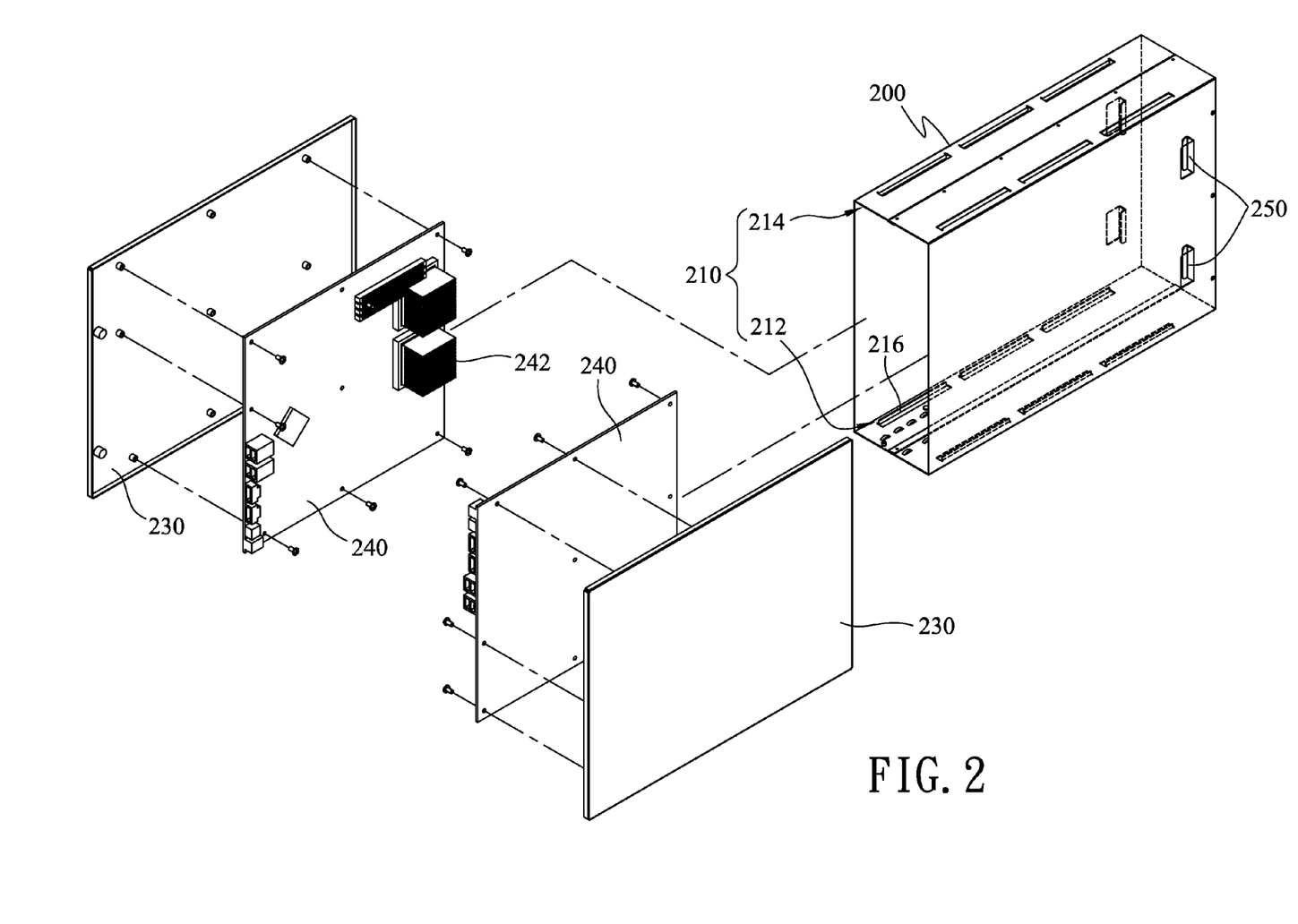
FIG. 2 is an exploded perspective view of a dual-board case for multi-mainboard system according to a first embodiment of the present invention.
Figure 3:
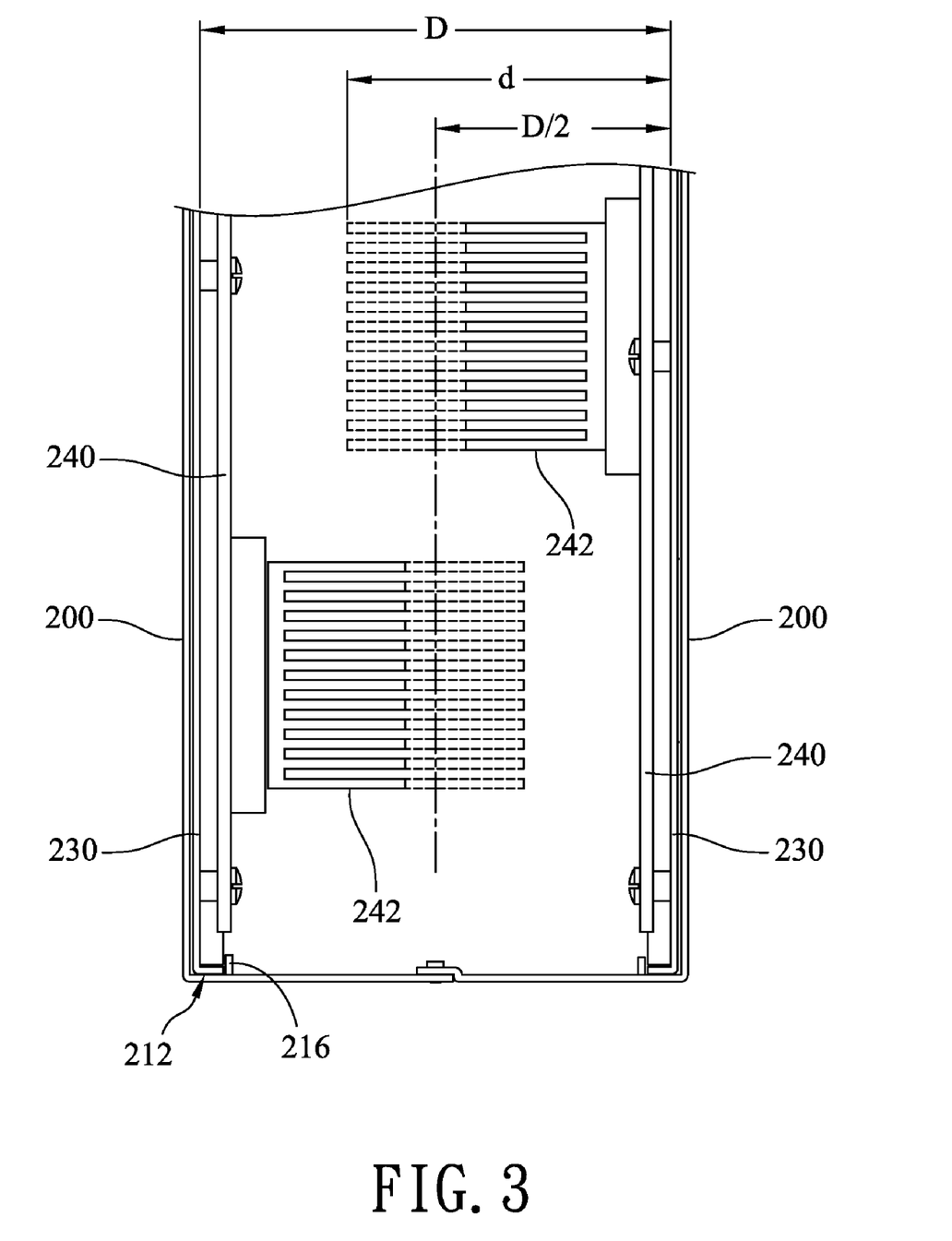
FIG. 3 is a fragmentary sectional view of a dual-board case for multi-mainboard system according to a second embodiment of the present invention.
Figure 6:
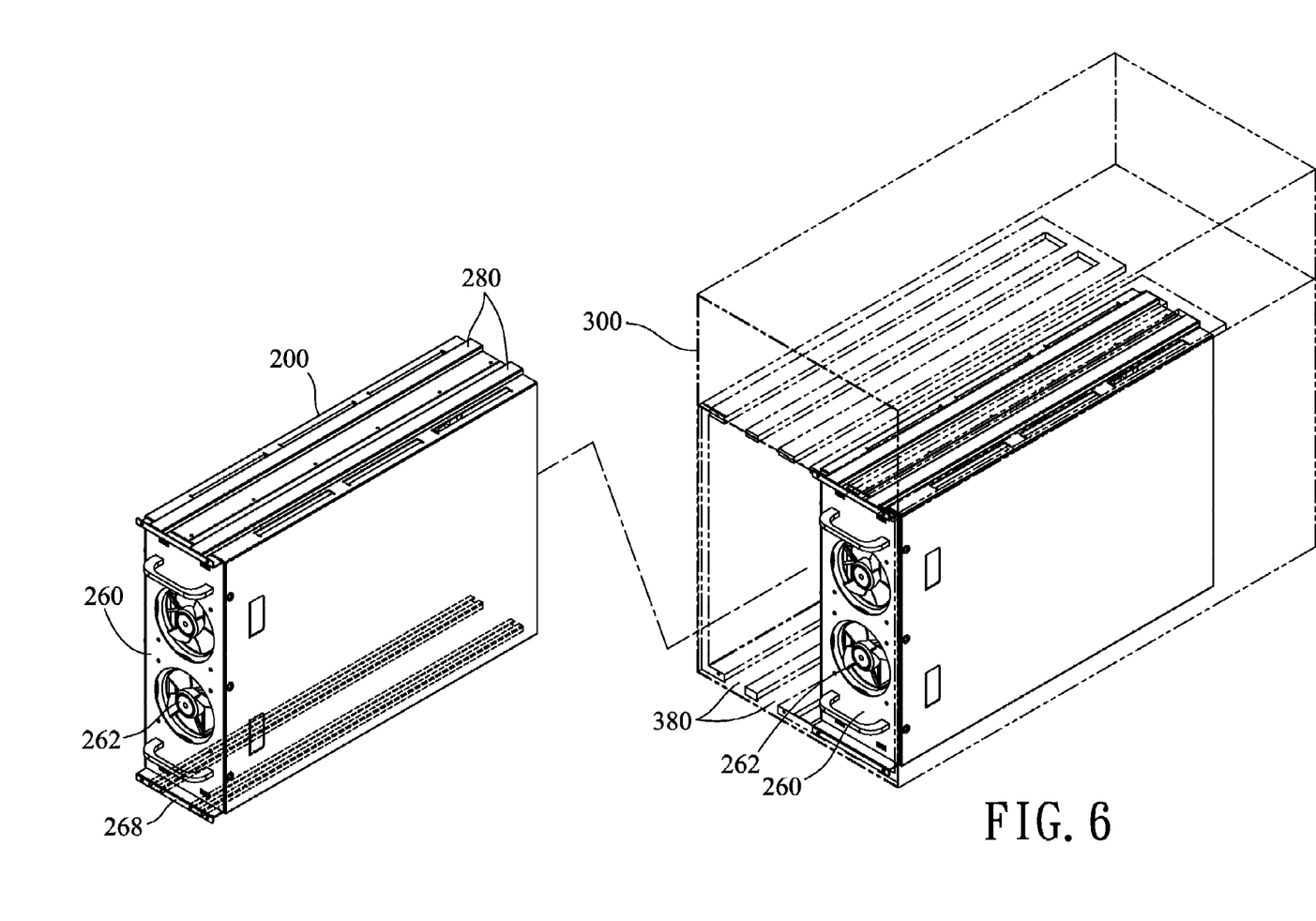
FIG. 6 shows the mounting of a dual-board case according to a fifth embodiment of the present invention into a computer case for a multi-mainboard system.

Please refer to FIGS. 2 and 3. A dual-board case for multi-mainboard system according to a first embodiment of the present invention includes a tubular housing 200, two track sets 210, and two mainboard trays 230. The tubular housing 200 may be mounted in a computer case 300 for a multi-mainboard system as shown in FIG. 6.

The tubular housing 200 has a substantially rectangular cross section to define a top wall, a bottom wall, two opposite lateral walls, and two opposite open ends. The tubular housing 200 may be formed from two U-shaped panels or from one single panel that is bent and connected at two opposite ends.

Each of the two track sets 210 includes two tracks 212, 214 mounted to an interior of the bottom and the top wall, respectively, of the tubular housing 200 to extend between the two open ends of the tubular housing 200. That is, the tracks 212, 214 in the same track set 210 are parallel to each other and extended from one open end of the tubular housing 200 to the other open end thereof.

The mainboard trays 230 are separately movably mounted on the two track sets 210. Each of the mainboard trays 230 has a loading surface 232, on which a mainboard 240 is mounted. And, the two mainboard trays 230 are mounted on the two track sets 210 with their loading surfaces 232 facing toward each other. That is, the two loading surfaces 232 with the mainboards 240 mounted thereon face each other with a predetermined distance D left between them.

In other words, the two mainboards 240 mounted on the loading surfaces 232 of the two mainboard trays 230 are oriented to face each other with an integral and relatively large airflow passage formed therebetween. Radiation fins 242 are mounted on heat-producing elements, such as processors, on the mainboards 240 to locate near one of the two open ends of the tubular housing 200. That is, the radiation fins 242 are located between the two loading surfaces 232 that are spaced from each other by a fixed distance D. The processors or other heat-producing elements on the two facing mainboards 240 are staggered. Therefore, the radiation fins 242 mounted on the processors and other heat-producing elements on the two mainboards 240 are staggered, too. In this manner, the fixed distance D between the two loading surfaces 232 may be shortened to reduce an overall volume of the tubular housing 200, or the radiation fins 242 may have an extended size. More specifically, a top of the radiation fins 242 may be located beyond a centerline of the tubular housing 200. In other words, a distance d between the top of the radiation fins 242 on a mainboard 240 and the loading surface 232 of the mainboard tray supporting the same mainboard 240 is larger than or equal to one half of the fixed distance D.

Therefore, it is possible to enhance the heat-dissipation effect of the dual-board case of the present invention by increasing the size of the radiation fins 242 without increasing the size of the whole tubular housing 200. On the other hand, the staggered processors, heat-producing elements, and radiation fins 242 also provide the possibility of reducing the volume of the tubular housing 200, enabling the dual-board case of the present invention to have a volume even smaller than that of the conventional personal supercomputer with a plurality of parallelly arranged mainboards oriented to the same direction.

The tubular housing 200 defines an inner space communicating with the two open ends, so that airflow may flow through the inner space of the tubular housing 200 to carry away heat produced by heat sources on the two mainboards 240 in the tubular housing 200. Since the two mainboards 240 are mounted in the tubular housing 200 face to face, allowing the inner space of the tubular housing 20 to form an integral and relatively large airflow passage without being split and hindered by the mainboards 240 and other related elements thereon, such as radiating modules, so that noises produced during operation of heat-producing elements on the mainboards 240 may be largely reduced. Since the integral large airflow passage between the two face-to-face mainboards 240 allows airflow to quickly flow therethrough, enhanced heat-dissipation efficiency may be obtained. Moreover, the mainboard trays 230 may be conveniently inserted into the tubular housing 200 via one open end thereof to move along the tracks 212, 214, and pulled along the tracks 212, 214 to move out of the tubular housing 200 via the same open end. Therefore, the mainboards 240 mounted on the movable mainboard trays 230 may be conveniently dismounted and adjusted when necessary.

Each of the tracks 212, 214 includes one or more guide plates 216 vertically located on the interior of the bottom wall or the top wall of the tubular housing 200. Preferably, an angle about 90 degrees is contained between the guide plates 216 and the bottom wall and the top wall of the tubular housing 200. A predetermined distance is left between the guide plates 216 in each track set 210 and one lateral wall of the tubular housing 200 adjacent to that track set 210 to define a space for receiving the mainboard tray 230 therein. And, one or more stoppers 250 may be further provided on the walls of the tubular housing 200 corresponding to each of the two track sets 210, so as to stop the mainboard trays 230 inserted into the tracks 212, 214 via one open end of the tubular housing 200 from moving out of the tubular housing 200 via the other open end thereof. The stoppers 250 may be sideward and inward extended from two lateral walls of the tubular housing 200, as shown in FIG. 2. Alternatively, the stoppers 250 may be vertically and inward extended from the bottom wall and the top wall of the tubular housing 200 (not shown). And, it is preferable an angle about 90 degrees is contained between the stoppers 250 and the walls of the tubular housing 200. The stoppers 250 are L-shaped plates that may be fixedly attached to interior of the tubular housing 200 or terminal ends of the tracks 212, 214, or be directly formed on the tubular housing 200 by inward stamping and bending predetermined portions the walls of the tubular housing 200. Alternatively, the stoppers 250 may be formed by bending terminal ends of inner most guide plates 216 toward the tracks 212, 214.

The guide plates 216 may be directly formed on the tubular housing 200 by inward stamping the bottom wall and the top wall of the tubular housing 200, as shown in FIG. 2. Alternatively, the guide plates 216 may be one or more independent L-shaped plates fixedly attached to the interior of the bottom wall and the top wall of the tubular housing 200.

Figure 4:
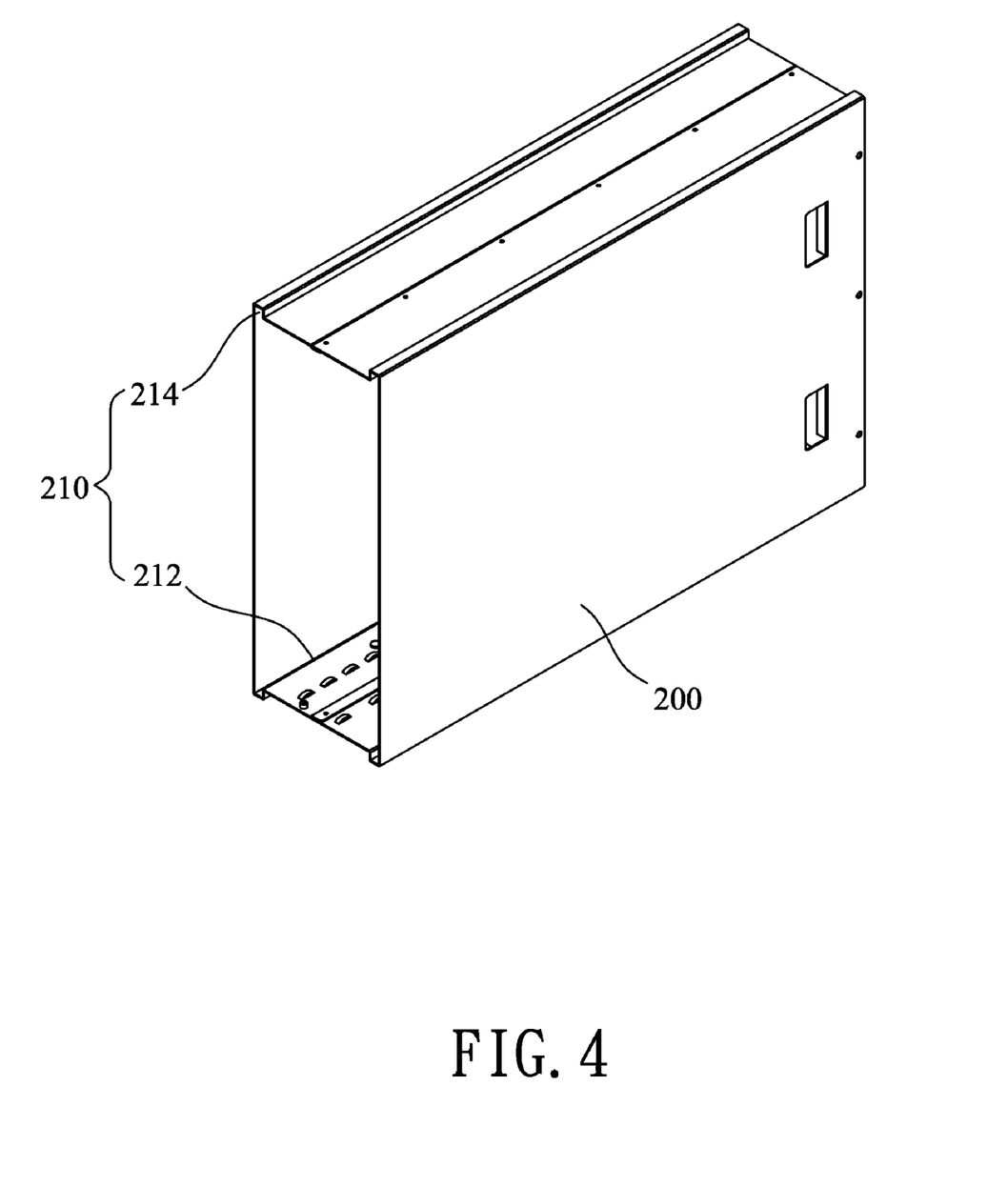
FIG. 4 is a perspective view of a tubular housing of a dual-board case for multi-mainboard system according to a third embodiment of the present invention.

Please refer to FIG. 4. The tracks 212, 214 may also be channel tracks formed on the tubular housing 200. That is, the tubular housing 200 is provided at predetermined positions on the bottom and the top wall with outward protruded portions to form channel tracks for receiving lower and upper ends of the mainboard trays 230 therein. The outward protruded and continuously extended channel tracks allow the tubular housing 200 of the dual-board case of the present invention to be more conveniently mounted into the computer case 300 of the multi-mainboard system shown in FIG. 6. As a matter of fact, the channel tracks 212, 214 may be otherwise formed on the exterior of the bottom and top walls of the tubular housing 200 to protrude into the tubular housing 200 to provide the same function of guiding the mainboard trays 230 to move in the tubular housing 200.

In the illustrated embodiments, there are two tracks 212, 214 included in each of the two track sets 210. However, it is also possible each of the two track sets 210 has only one track 212 or 214.

Figure 5:
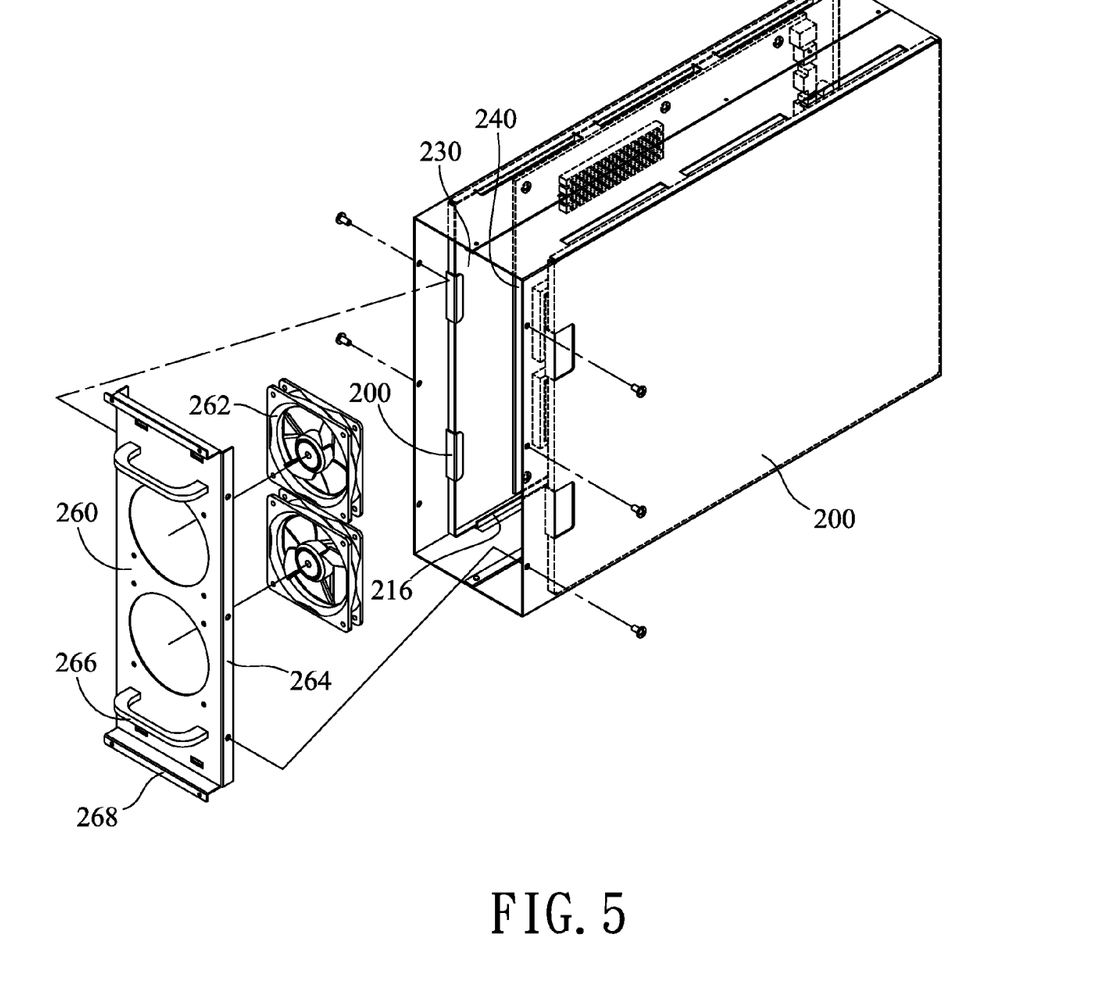
FIG. 5 is a partially exploded perspective view of a dual-board case for multi-mainboard system according to a fourth embodiment of the present invention.

Please refer to FIG. 5. The tubular housing 200 may be provided at one of the two open ends with a substantially rectangular cover plate 260 corresponding to a cross section of the tubular housing 200. And, a plurality of fan vents may be formed on the cover plate 260.

On an interior of the cover plate 260 facing toward the tubular housing 200, a plurality of cooling fans 262 are mounted corresponding to the fan vents to assist in smooth flowing of cooling airflow in the tubular housing 200. Since the tubular housing 200 provides integral and relatively large airflow passage, the problems of turbulences, whooshing sound, and noise caused by operating fans as occurred in the split airflow passage in the conventional computer case 100 can be largely reduced. Moreover, cooling fans 262 with increased size may be used in the tubular housing 200 to supply sufficient air flow and air pressure at low rotary speed without producing too much noise.

The cover plate 260 includes one or more mounting sections 264 that are rearward extended from two lateral edges or other suitable positions of a main body of the cover plate 260, so that an angle about 90 degrees is contained between the mounting sections 264 and the main body of the cover plate 260. The cover plate 260 is connected at the mounting sections 264 to two lateral walls of the tubular housing 200, so as to close the open end of the tubular housing 200. In this case, the mainboard trays 230 are inserted into or removed from the tubular housing 200 via the other open end opposite to the cover plate 260.

The cover plate 260 may be provided on an exterior with handles 266 to enable easy displacement of the dual-board case. The handles 266 may be U-shaped as shown in FIG. 5, or L-shaped, or any other suitable shapes that allow a user to grip at conveniently.

The cover plate 260 is also formed at an upper and/or a lower edge with one or more substantially L-shaped fixing sections 268. Each of the L-shaped fixing sections 268 has a horizontally portion outward extended from the upper and/or the lower edge of the cover plate 260 for fixing to an external mechanism, such as the computer case 300 of a multi-mainboard system shown in FIG. 6.

Please refer to FIG. 6. The tubular housing 200 may be externally provided at the exterior of the top and/or the bottom wall with locating tracks 280 extended between the two open ends of the tubular housing 200. The locating tracks 280 are corresponding to channels 380 formed on a case of an external mechanism to movably associate with the channels 380. In the illustrated embodiment in FIG. 6, the case of the external mechanism is a computer case 300 of a multi-mainboard system. The locating tracks 280 may be a narrow and elongate member formed by bending a flat plate, and have reduced terminal ends to provide good guiding function.

Figure 7:
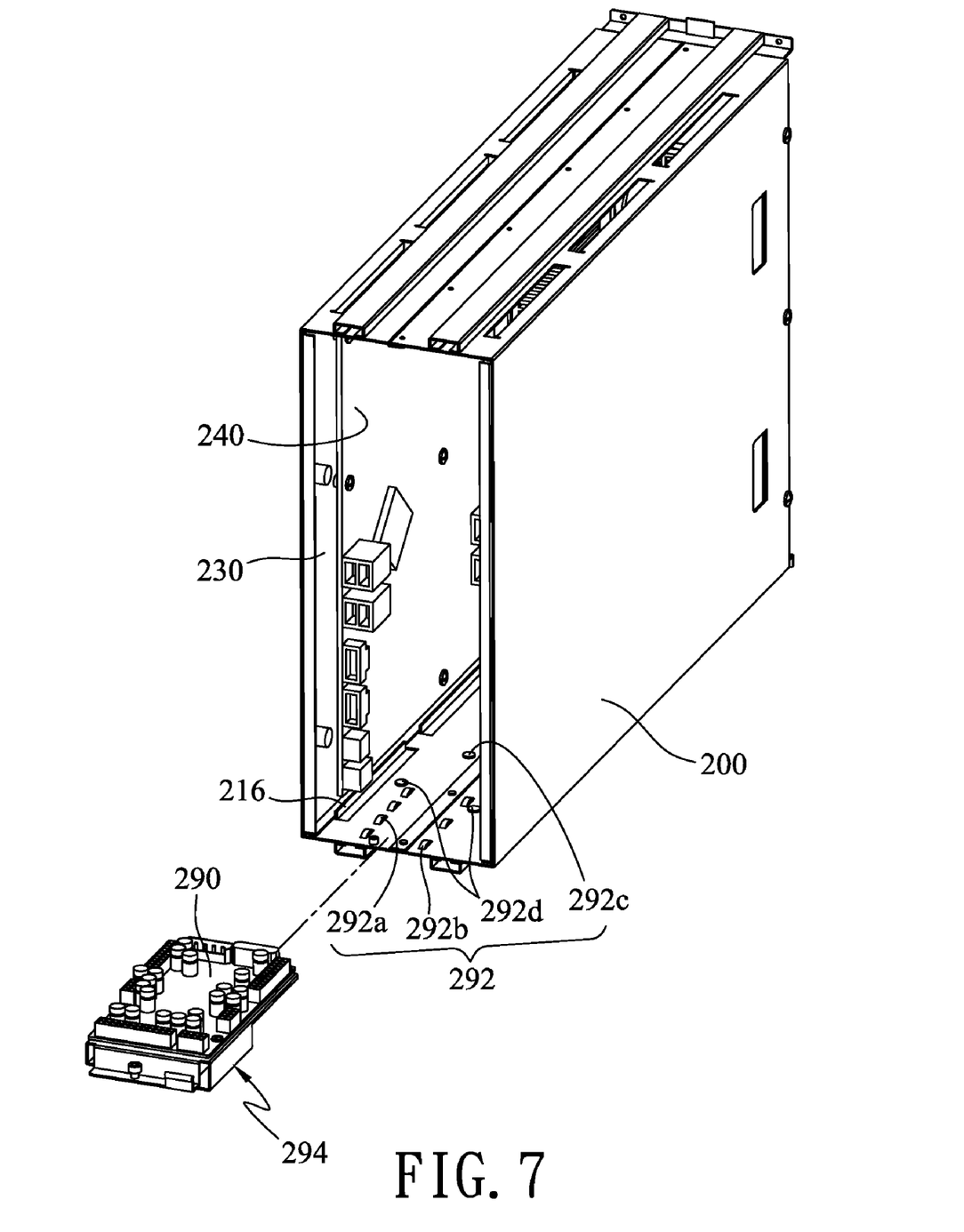
FIG. 7 is a partially exploded perspective view of a dual-board case for multi-mainboard system according to a sixth embodiment of the present invention.

Since the tubular housing 200 provides an integral and relatively large inner space, a power distribution board 290 for the dual-board case may also be mounted in the tubular housing 200, as shown in FIG. 7. For this purpose, the tubular housing 200 is provided on the interior of the bottom wall at a predetermined position with a locating unit 292, and the power distribution board 290 is mounted on a top of a carrier 294, which is connected at an underside to the locating unit 292.

Figure 7A:
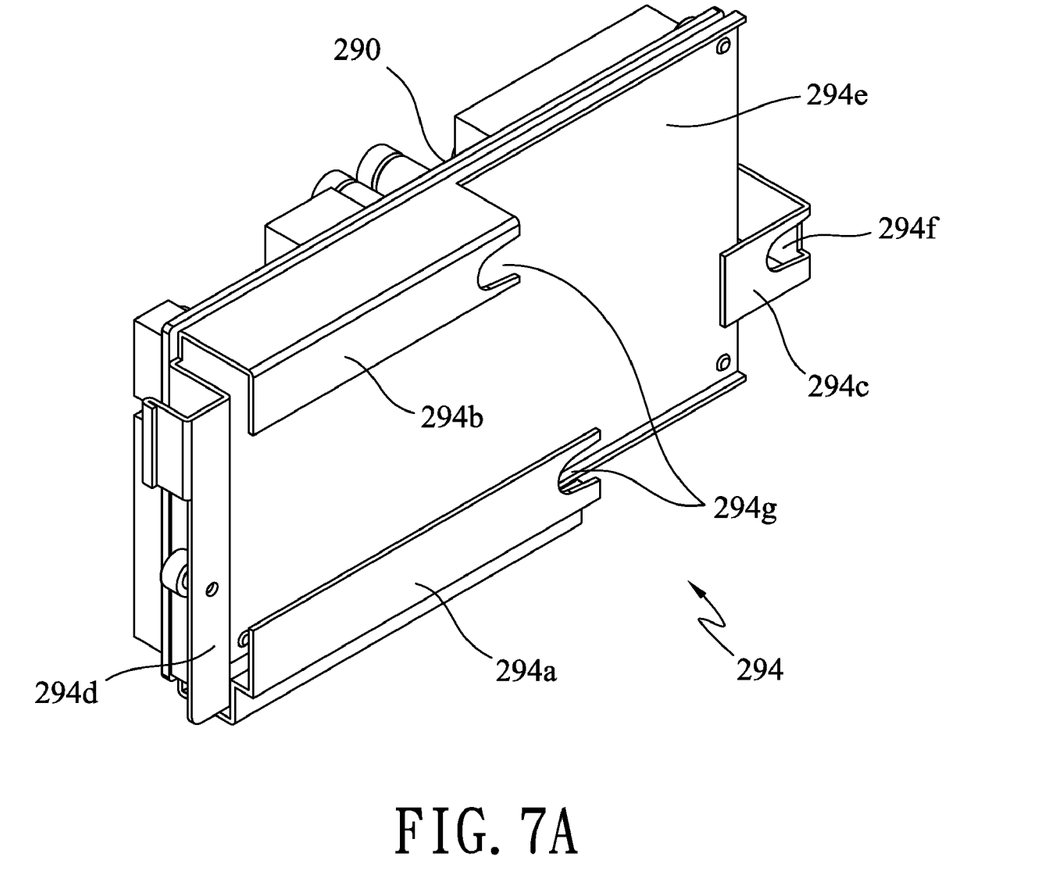
FIG. 7A is a rear perspective view of a carrier included in the sixth embodiment of FIG. 7.

The locating unit 292 may include two guide ways 292a, 292b, each of which includes a row of upward protrusions formed by inward stamping the bottom wall of the tubular housing 200, and one or more locating blocks 192c, 292d. Please refer to FIG. 7A. The carrier 294 includes a flat main body 294e, two substantially L-shaped or step-shaped sliding tracks 294a, 294b, a stop element 294c, and a mounting section 294d. The two L-shaped sliding tracks 294a, 294b are connected at respective vertical portions to two lower lateral sides of the main body 294e with respective horizontal portions flatly contacting with the interior of the bottom wall of the tubular housing 200 adjacent to the two guide ways 292a, 292b, so that the carrier 294 is connected to and movable along the two guide ways 292a, 292b in the tubular housing 200. The stop element 294c is a substantially L-shaped or step-shaped member with an upper end connected to a front edge of the main body 294e of the carrier 294. A pre-cut opening 294f is formed at the corner of the L-shaped stop element 294c for detachably engaging with the locating block 292c, so as to define a final position to which the carrier 294 may be slid into the tubular housing 200 along the guide ways 292a, 292b. When the carrier 294 has been fully slid into the tubular housing 200, the mounting section 294d located at a rear end of the carrier 294 is screwed to the tubular housing 200, so that the carrier 294 is fixedly connected to the tubular housing 200. Moreover, the two sliding tracks 294a, 294b are provided on respective horizontal portions at an end closer to the stop element 294c with a recess 294g each for detachably engaging with the locating blocks 292d, so as to further limit the position of the carrier 294 in the tubular housing 200.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A dual-board case for a multi-mainboard computer system for configuring two mainboards in the computer system, the dual-board case comprising:

a tubular housing being substantially rectangular and having a bottom wall, a top wall, two opposite lateral walls, and two opposite open ends;

a pair of track sets, each of which including at least one track located at one of the top wall and the bottom wall and extended to the open end of the tubular housing; and a pair of mainboard trays being movably and respectively mounted on the track sets, each of the mainboard trays having a loading surface on which a mainboard is mounted, and wherein the mainboard trays are arranged in the tubular housing such that the loading surfaces are facing each other with a predetermined distance there between.

2. The dual-board case of claim 1, wherein each of the tracks includes at least one guide plate vertically located inside the tubular housing.

3. The dual-board case of claim 2, wherein the guide plate is located at a predetermined distance for receiving the mainboard tray from the lateral wall of the tubular housing adjacent to the guide plate.

4. The dual-board case of claim 1, wherein each of the tracks is a channel track protruding from the interior to the exterior of the tubular housing.

5. The dual-board case of claim 1, wherein each of the tracks is a channel track protruding from the exterior to the interior of the tubular housing.

6. The dual-board case of claim 1, further comprising at least one stopper corresponding to the track set, perpendicularly located inside the tubular housing to control location of the mainboard tray.

7. The dual-board case of claim 6, wherein the stopper is an L-shaped plate fixedly attached inside the tubular housing or formed by bending the tubular housing inwardly.

8. The dual-board case of claim 1, further comprising at least one stopper corresponding to the track set, perpendicularly located at one end of the track set to control location of the mainboard tray.

9. The dual-board case of claim 8, wherein the at least one stopper is an L-shaped plate fixedly attached to one end of the track set, or an inward stamped and bent portion at the rear end of each of the two track sets.

10. The dual-board case of claim 1, further comprising at least one substantially rectangular cover plate for mounting to one of the open ends of the tubular housing; and the at least one cover plate being provided with a plurality of fan vents.

11. The dual-board case of claim 10, wherein the cover plate includes at least one mounting section perpendicularly rearward extended from the cover plate for connecting to the tubular housing.

12. The dual-board case of claim 11, wherein the mounting section is located on the lateral edge of the cover plate.

13. The dual-board case of claim 10, wherein the cover plate includes at least one substantially L-shaped fixing section formed along the upper or lower edge of the cover plate; and the fixing section having a horizontally portion outward extended from the upper or lower edge of the cover plate.

14. The dual-board case of claim 10, wherein the cover plate includes at least one handle located on the cover plate.

15. The dual-board case of claim 10, wherein the mainboard trays are movably mounted in the tubular housing via one of the two open ends of the tubular housing opposite to the cover plate.

16. The dual-board case of claim 1, wherein the two mainboards comprise a first mainboard and a second mainboard mounted on respective loading surfaces in the tubular housing so as to be facing each other, each mainboard including at least one radiation fin, wherein a distance from a top of each radiation fin to the loading surface on which the mainboard is mounted is larger than or equal to one half of the predetermined distance between the two loading surfaces, and wherein the at least one radiation fin disposed on the first mainboard is staggered relative to the at least one radiation fin disposed on the second mainboard.

17. The dual-board case of claim 1, wherein the tubular housing is formed from two U-shaped panels connected to each other.

18. The dual-board case of claim 1, further comprising:
a locating unit provided on the interior of the bottom wall of the tubular housing; and
a carrier having a top for carrying a power distribution board thereon, and an underside provided corresponding to the locating unit with at least one sliding track, at least one stop element, and at least one mounting section.

19. The dual-board case of claim 18, wherein the locating unit includes two guide ways, each of which includes a row of upward protrusions formed by inward stamping the bottom wall of the tubular housing, and at least one locating block.

20. The dual-board case of claim 1, further comprising at least one locating track provided on the exterior of the tubular housing to extend between the two open ends of the tubular housing.

21. The dual-board case of claim 20, wherein the locating track is a narrow and elongate member formed by bending a plate, and has at least one reduced end.

\* \* \* \* \*